United States Patent [19]

Matsuura et al.

[11] Patent Number: 5,132,774

[45] Date of Patent: Jul. 21, 1992

[54] SEMICONDUCTOR DEVICE INCLUDING INTERLAYER INSULATING FILM

[75] Inventors: Masazumi Matsuura; Hideo Kotani; Atsuhiro Fujii; Shigeo Nagao; Hideki Genjo, all of Hyogo, Japan

[73] Assignee: Mitsubishi Denki Kabushiki Kaisha, Tokyo, Japan

[21] Appl. No.: 618,284

[22] Filed: Nov. 28, 1990

[30] Foreign Application Priority Data

Feb. 5, 1990 [JP] Japan ................................. 2-26751
Nov. 6, 1990 [JP] Japan ................................. 2-301467

[51] Int. Cl.$^5$ .................. H01L 21/469; H01L 21/473
[52] U.S. Cl. .......................................... 357/71; 357/54
[58] Field of Search ................... 357/54, 71, 67; 437/235, 238, 241, 243, 978, 979

[56] References Cited

U.S. PATENT DOCUMENTS

| | | | |
|---|---|---|---|
| 4,729,006 | 3/1988 | Dally et al. | 357/54 |
| 4,872,947 | 10/1989 | Wang et al. | 437/235 |
| 4,894,352 | 1/1990 | Lane et al. | 437/238 |
| 4,981,810 | 1/1991 | Fazan et al. | 437/238 |
| 5,028,566 | 7/1991 | Lagendijk | 437/235 |
| 5,051,380 | 9/1991 | Maeda et al. | 437/235 |
| 5,069,747 | 12/1991 | Cathey et al. | 437/238 |

OTHER PUBLICATIONS

"Low Temperature APCVD Oxide Using TEOS-Ozone Chemistry for Multilevel Interconnectoins'-'—Kotani et al—The International Electron Devices Meeting 1989, pp. 28.21-28.24.
International Electron Devices Meeting 1989, Washington, D.C. Dec. 3-6, 1989.

*Primary Examiner*—ROlf Hille
*Assistant Examiner*—S. V. Clark
*Attorney, Agent, or Firm*—Lowe, Price, LeBlanc & Becker

[57] ABSTRACT

The method of forming an interlayer insulating film insulating first and second layers of conductor patterns in a semiconductor device includes the steps of preparing a reaction gas including at least ozone and silicon alkoxide, wherein the ratio of ozone with respect to silicon alkoxide is adjusted to be not less than 5 within the reaction gas, and forming an insulating film by CVD reacting the reaction gas at atmospheric pressure at the temperature of 350° C.–450° C., whereupon the interlayer insulating film includes at least the insulating film formed by atmospheric pressure CVD reaction.

6 Claims, 11 Drawing Sheets $D = (1 - d_{min}/d_0)$

SEMICONDUCTOR DEVICE INCLUDING INTERLAYER INSULATING FILM

BACKGROUND OF THE INVENTION

1. Field of the Invention

The invention relates generally to a semiconductor device including an insulating film, and more particularly, to improvements in a semiconductor device including an interlayer insulating film mutually insulating a first layer and a second layer of conductor patterns.

2. Description of the Background Art

FIGS 11A-11D are schematic sectional views for explaining a method of forming an interlayer insulating film by prior art.

Referring to FIG. 11A, a first silicon oxide film 3 is formed over a substrate 1 by the plasma CVD (Chemical Vapor Deposition) method to cover a first conductor pattern 2 formed on the semiconductor substrate 1. In this plasma CVD method, tetraethoxysilane (TEOS: Si $(OC_2H_5)_4$) which is a kind of silicon alkoxide and oxygen ($O_2$) gas are reacted with the aid of plasma energy under the pressure of several Torrs at the temperature of 370° C.–420° C. to deposit a first silicon oxide film 3 to the thickness of approximately 0.5 μm. This first silicon oxide film 3 will be referred to as TEOS-PCVD oxide film hereinafter.

Referring to FIG. 11B, a second silicon oxide film is formed over the TEOS-PCVD oxide film 3 by a low pressure CVD method. TEOS and ozone ($O_3$) are reacted at 370°–420° C. under the pressure of several 10 Torrs in this low pressure CVD method to deposit a second silicon oxide film 4 to the thickness of approximately 0.5 μm. This second oxide film 4 will be referred to as TEOS-LPCVD oxide film hereinafter.

Referring to FIG. 11C, a SOG (Spin-On-Glass) film 5 is formed on the second silicon oxide film 4 by baking at 450° C. for 30-60 minutes. The SOG 5 is partly etched anisotropically to make smooth the upper surface of the TEOS-LPCVD oxide film 4.

Referring to FIG. 11D, silane gas, $O_2$ gas, and phosphine gas are reacted at the temperature of 400°–450° C. by a low pressure CVD method or an atmospheric pressure CVD method above the smoothed surface to deposit a PSG (Phosphorus Silicate Glass) film 6 to the thickness of approximately 0.2 μm. The second conductor pattern (not shown) is formed over these interlayer insulating films 3–6.

FIG. 12 shows sections of contact holes 7 penetrating the interlayer insulating films 3–6 formed by the prior art shown in FIGS. 11A–11D with second layer conductors 8 connected to the first layer conductor 2 and the semiconductor substrate 1. The contact hole 7 is formed by plasma etching and wet etching. It can be seen from the view that the TEOS-LPCVD oxide film 4 is always exposed at the sidewall of the contact hole 7, whereas the SOG film 5 is only exposed depending on the location of the contact hole. This is because the TEOS-LPCVD oxide film 4 is continuous, whereas the SOG film 5 is patterned. When the second layer conductor 8 is formed by vacuum evaporation, sputtering, etc., the TEOS-LPCVD oxide film 4 and SOG film 5 discharge moisture in the contact hole 7, as shown by arrows in FIG. 12. Consequently, the sidewall of the contact hole 7 may not be completely covered by the second layer conductor 8, leading to some cases where satisfactory interlayer connection is not achieved.

FIG. 13 is a graph showing the infrared absorption of the TEOS-LPCVD oxide film. The abscissa axis represents the wave number ($cm^{-1}$), while the ordinate axis represents the transmittance (%). As shown by arrow A, light absorption by Si-OH bonding occurs in the vicinity of the wave number of 3450 $cm^{-1}$. This absorption coefficient of approximately 3000 ($cm^{-1}$) by this Si-OH bonding is a great value. The TEOS-LPCVD oxide film 4 including many Si-OH bonding will discharge moisture during evaporation process and sputtering process in the vacuum to become the cause of the above mentioned incomplete interlayer connection. In addition, the SOG film 5 includes even a greater number of Si-OH bonds than the TEOS-LPCVD oxide film 4. Accordingly, the interlayer connection will tend to become incomplete if the connection penetrates the SOG film 5.

If the silicon oxide film including Si-OH bonding is annealed, moisture will be discharged to cause shrinking, and cracks are liable to be created in the film. These cracks will degrade the insulation of the silicon oxide film. In practice, under 30 minutes of annealing at 450° C., the TEOS-LPCVD oxide film will shrink 10-15% in thickness, while the SOG film will shrink 20-30% in thickness. This annealing step is inevitably performed after the formation of TEOS-LPCVD oxide film 4 and SOG film 5. For example, annealing is performed to compensate for radiation damage of the transistor formed by ion implantation.

Therefore, the silicon oxide film which shrinks by annealing may not have its film thickness increased to prevent the generation of cracks. If the thickness of the film is increased, stress due to shrinkage will become greater to facilitate the generation of cracks. To prevent the generation of cracks, the thickness of the TEOS-LPCVD oxide film is preferably not more than 0.5 μm, while the thickness of the SOG film is preferably not more than 0.4 μm. This limitation regarding the thickness of the films is one of the reasons for the interlayer insulating films 3–6 to have a multilayer structure. That is to say, it is generally preferable for the interlayer insulating film to have a thickness of 0.8–1.2 μm. If the interlayer insulating film is thinner than 0.8 μm, the breakdown voltage of the interlayer insulating film will become insufficient with the possibility of parasitic capacitance. On the other hand, if the interlayer insulating film is thicker than 1.2 μm, it will become difficult to pattern the interlayer insulting film by etching or to form a contact hole. It is also difficult to form a conductive layer at the edge of the patterned interlayer insulating film or over the high sidewalls of the contact hole. However, if an interlayer insulating film of such thickness is formed by a single silicon oxide film comprising a number of Si-OH bonds, there is the possibility that cracks may be generated in the film.

The major characteristics required in interlayer insulating films are listed as below:

(1) The interlayer insulating film has a smoothed upper surface so that a second layer conductor pattern is easily formed without disconnection on the interlayer insulating film.
(2) Gas discharge from the interlayer insulating film, particularly gas discharge within the contact hole, is minimized to achieve satisfying adhesion of the second layer conductor pattern to the interlayer insulating film.
(3) The interlayer insulating film has satisfying insulation without cracks.

The interlayer insulating films 3-6 of the prior art shown in FIG. 7 at least can not sufficiently satisfy the characteristic of (2), with a further problem of having a complex formation method due to its multilayer structure.

SUMMARY OF THE INVENTION

In view of the foregoing, an object of the present invention is to provide a semiconductor device without the possibility that a second conductor pattern formed on the interlayer insulating film includes disconnection by feature of the interlayer insulating film having a smooth upper surface, and a manufacturing method thereof.

Another object of the present invention is to provide a semiconductor device allowing the formation of a second conductor pattern with satisfactory adhesion over the interlayer insulating film and over the inside wall of the contact hole, by feature of minimum gas discharge from the interlayer insulating film, and a manufacturing method thereof.

A still further object of the present invention is to provide a semiconductor device having satisfactory insulation by feature of the interlayer insulating film not having cracks, and a manufacturing method thereof.

According to an aspect of the present invention, a semiconductor device includes a first layer conductor pattern, an interlayer insulating film containing at least an insulating film formed by CVD reacting a reaction gas containing at least silicon alkoxide and ozone having the ratio of ozone to silicon alkoxide adjusted to be not less than 5 under atmospheric pressure at a temperature of 350° C.-450° C., so as to cover the first layer conductor pattern, and a second layer conductor pattern formed on the interlayer insulating film.

According to another aspect of the present invention, the method of forming the interlayer insulating film mutually insulating first and second layers of conductor patterns in a semiconductor device is characterized by the steps of preparing reactive gas including at least ozone and silicon alkoxide, such that the ratio of ozone to silicon alkoxide may be adjusted to be not less than 5, and forming an insulating film by CVD reacting the reaction gas under atmospheric pressure at the temperature of 350°-450° C., in which the interlayer insulating film will comprise an insulating film formed by atmospheric pressure CVD reaction.

In formation of the interlayer insulating film according to the present invention, the reaction gas including ozone and silicon alkoxide has the ratio of ozone to silicon alkoxide adjusted to be not less than 5. Then, this reaction gas is reacted at the temperature of 350°-450° C. by atmospheric pressure CVD to make it possible to obtain the oxide insulating film to the thickness of not less than 1.2 μm having a smoothed upper surface and minimum gas discharge with the less possibility of crack generation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1A-1E are schematic sectional views for explaining the process of manufacturing a semiconductor device in accordance with an embodiment of the present invention.

Figure 1A:
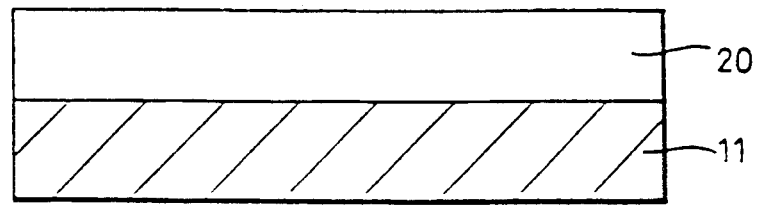
FIGS. 1A-1E are schematic sectional views showing an example of the process of manufacturing a semiconductor device formed by the method of the present invention.

Referring to FIG. 1A, a first insulating film 20 is formed to cover a semiconductor substrate 11 having transistors (not shown) and the like and polysilicon wiring (not shown) for the connection thereof. The first insulating film 20 may be an oxide film deposited by a low pressure CVD method, or a PSG film or a BPSG (Boron Phosphorus Silicate Glass) film deposited by an atmospheric pressure CVD method.

Figure 1B:
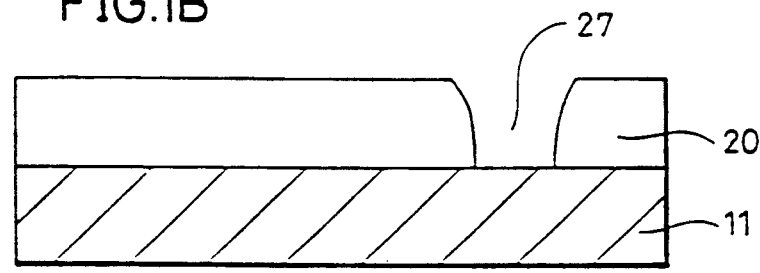

Referring to FIG. 1B, a contact hole 27 is formed at a given location in the first insulating film 20 by etching.

Figure 1C:
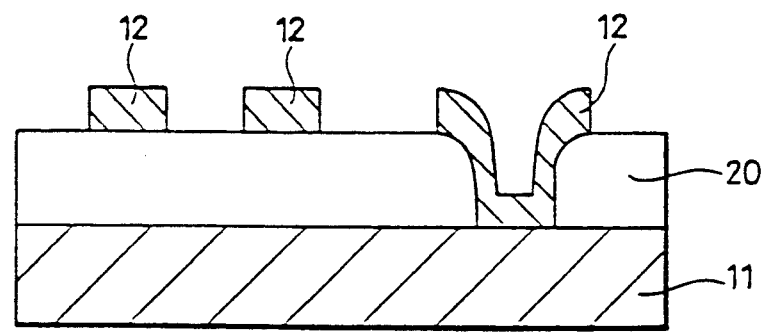

Referring to FIG. 1C, a first conductor layer 12 is formed over substrate 11 so as to cover the first insulating film 20, and patterned. The first conductor layer 12 may be formed by depositing aluminum by vacuum deposition or sputtering, for example.

Figure 1D:
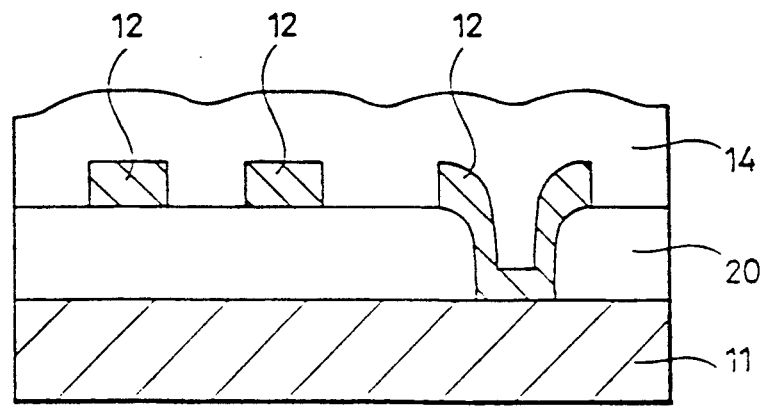

Referring to FIG. 1D, an interlayer insulating film 14 is formed to the thickness of approximately 1.0 μm over the first insulating film 20 so as to cover the first layer aluminum wiring pattern 12 by the inventive method. That is, reaction gas including ozone and TEOS are reacted at atmospheric pressure at the temperature within the range of 350°-450° C. to deposit an insulating film 14 of silicon oxide. At this time, the ratio of ozone to TEOS is adjusted to be not less than 5 within the reaction gas. The silicon oxide film deposited by the atmospheric pressure CVD is hereinafter referred to as TEOS-APCVD oxide film. This TEOS-APCVD oxide film may be deposited to have a smoothed upper surface.

Figure 1E:
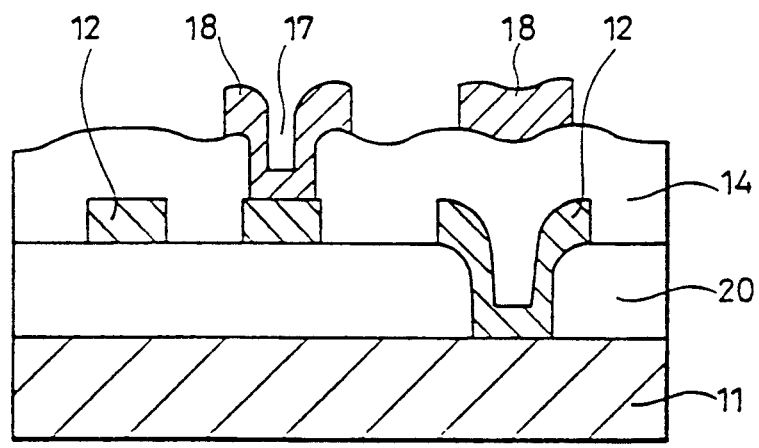

Referring to FIG. 1E, a contact hole 17 is formed at a given location in interlayer insulating film 14 by etching. Then, a second conductor layer 18 is formed to cover interlayer insulating film 14 and patterned. The second conductor layer 18 may be formed by depositing aluminum under vacuum evaporation or sputtering, for example. At this time, since the interlayer insulating film 14 of the TEOS-APCVD oxide film formed by the present invention discharges almost no moisture, the second layer conductor 18 adheres securely to the interlayer insulating film 14 to ensure the coverage of the sidewall of the contact hole 17.

Figure 2C:
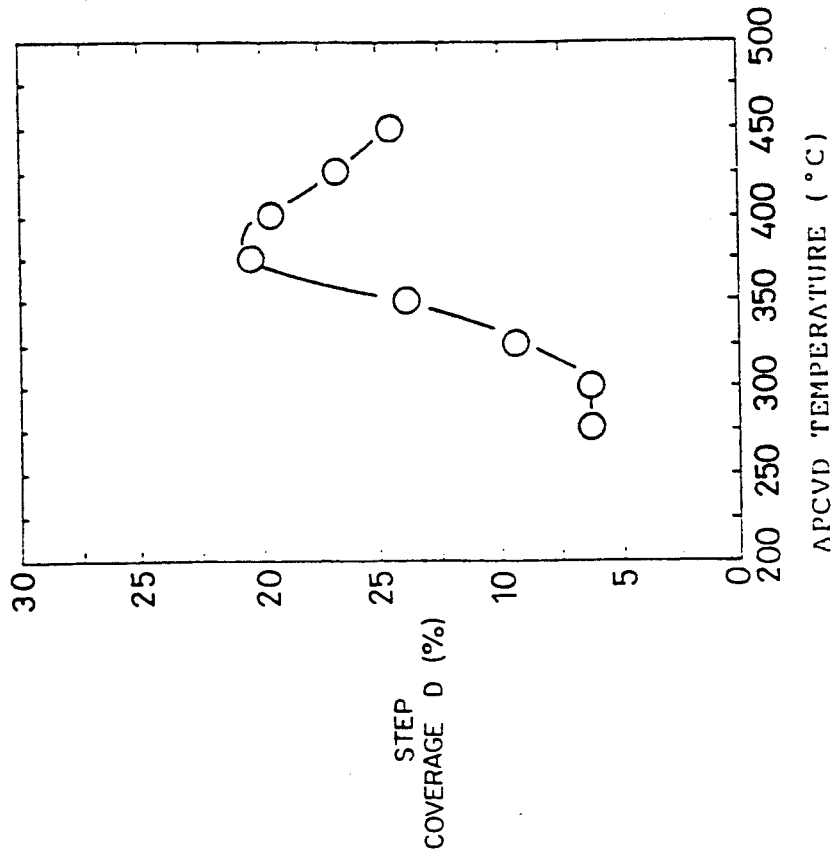
FIGS. 2A-2C are graphs showing the relationship between the various characteristics of the TEOS-APCVD oxide film deposited by $O_3$/TEOS=3.5 reaction gas and the APCVD temperature.
Figure 2A:
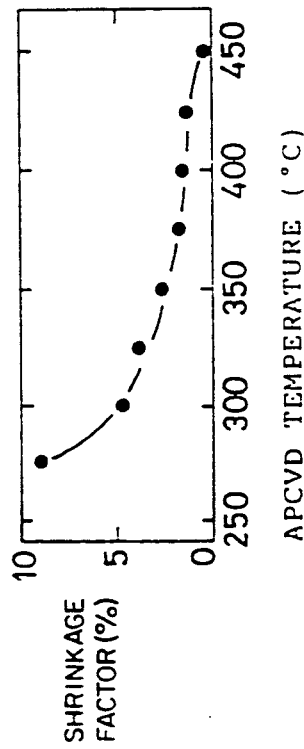
Figure 2B:
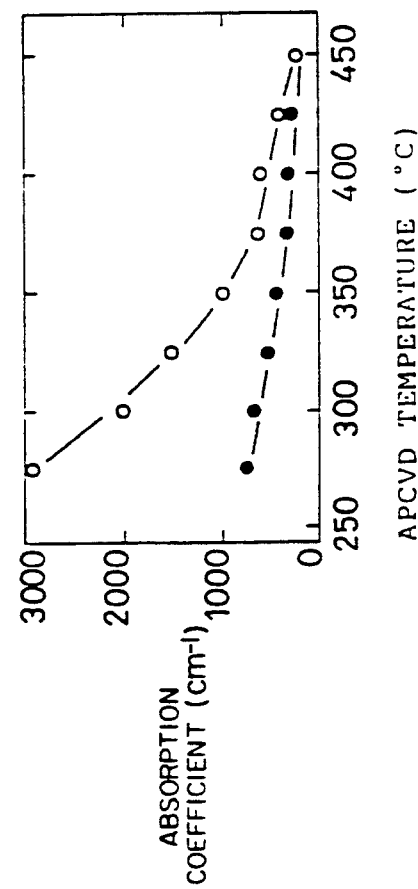

FIGS. 2A-2C are graphs showing the relationship between the various characteristics of the TEOS-APCVD oxide film deposited by $O_3/TEOS=3.5$ reaction gas and the APCVD temperature.

FIG. 2A shows the shrinkage factor (%) of the film thickness after the deposited TEOS-APCVD oxide film is annealed for 30 minutes at 450° C. It can be seen from this graph that the lower APCVD temperature is, the higher the shrinkage factor of the TEOS-APCVD oxide film is. When the APCVD temperature is below 320° C., the TEOS-APCVD oxide film with the thickness of approximately 1.0 μm has cracks generated within the film because of the shrinkage by annealing. Therefore, when TEOS-APCVD oxide film with the thickness of above approximately 1.0 μm is to be formed, it is preferred that the APCVD temperature is above 350° C. However, the APCVD temperature is also preferred to be not higher than 450° C. is general.

FIG. 2B shows the absorption coefficient (cm$^{-1}$) of the TEOS-APCVD oxide film regarding light having a wave number of 3450 cm$^{-1}$. The white circle represents the absorption coefficient of the TEOS-APCVD oxide film right after the deposition, while the black circle represents the absorption coefficient after the oxide film has been annealed for 30 minutes at 450° C. It can be seen from this graph that the TEOS-APCVD oxide film includes more Si-OH bonding in proportion to the decrease in APCVD temperature, causing more moisture to be discharged by annealing. In other words, the shrinkage of the TEOS-APCVD oxide film shown in FIG. 2A is closely related to the discharge of the moisture from the film by annealing.

Referring to FIG. 2C, the step coverage D (%) of the TEOS-APCVD oxide film is shown. The definition of the step coverage D will be described later in connection with FIG. 4. In summary, the smoothness of the upper surface of the TEOS-APCVD oxide film is proportional to the value of step coverage D. That is, the larger step coverage D is, the easier it will be to form the second layer conductor pattern 18 without disconnection. Also, it is known from experience that a step coverage D not less than 15% is desired in order to form a second conductor pattern 18 without disconnection. Therefore, as can be seen from FIG. 2C, the APCVD temperature is preferred to be within the range of 350°-450° C. also from the standpoint of step coverage.

Figure 3C:
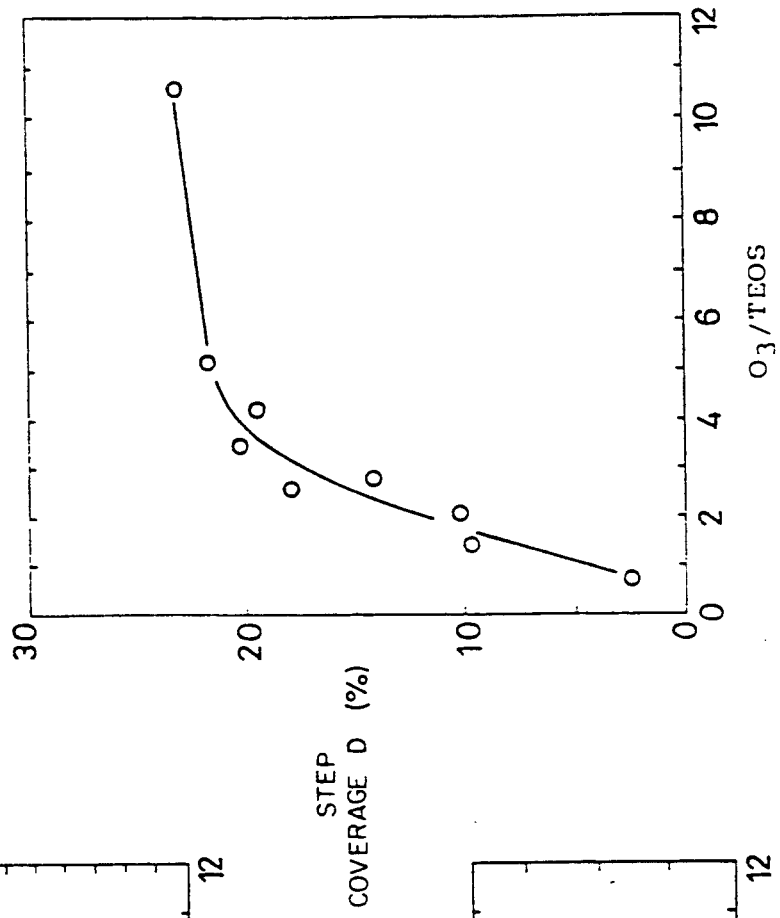
FIGS. 3A-3C are graphs showing the relationship between the various characteristics of the TEOS-APCVD oxide film deposited at the APCVD temperature of 375° C. and the ratio of $O_3$/TEOS.
Figure 3A:
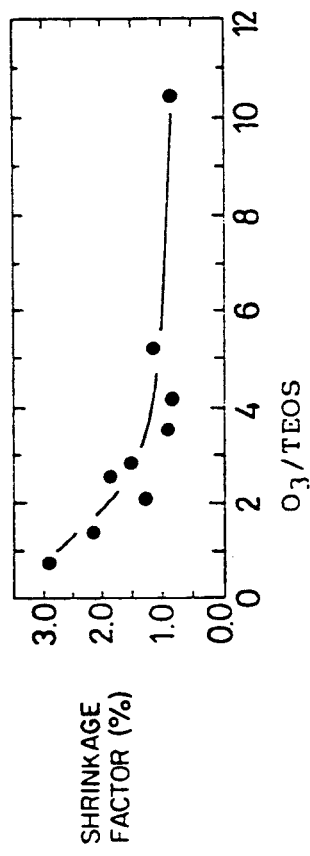
Figure 3B:
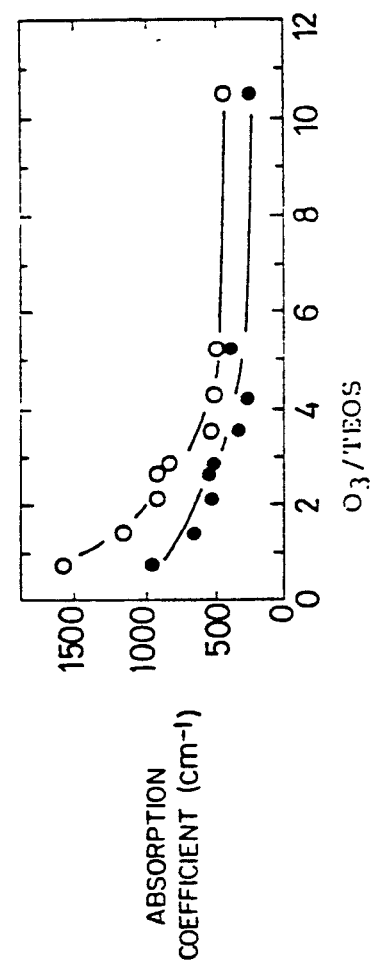

FIGS. 3A-3C are graphs showing the relationship of various characteristics of the TEOS-APCVD oxide film deposited at the APCVD temperature of 375° C. and the ratio of $O_3/TEOS$.

FIG. 3A shows the shrinkage factor (%) of the film thickness after the deposited TEOS-APCVD oxide film is annealed for 30 minutes at 450° C. It can be seen from this graph that the TEOS-APCVD oxide film has a very small shrinkage factor of not more than 1% in the range where $O_3/TEOS$ is not less than 5.

FIG. 3B shows the absorption coefficient (cm$^{-1}$) of the TEOS-APCVD oxide film with respect to light having the wave number of 3450 cm$^{-1}$. The white circle represents the absorption coefficient of the TEOS-APCVD oxide film right after the deposition, while the black circle represents the absorption coefficient after 30 minutes of annealing at 450° C. It can be seen from this graph that the TEOS-APCVD oxide film right after the deposition includes only a little Si-OH bonding in the range where $O_3/TEOS$ is not less than 5 and will discharge almost no moisture even when annealed.

Referring to FIG. 3C, the step coverage D (%) of the TEOS-APCVD oxide film is shown. It can be seen from this graph that the step coverage D is almost saturated with a high value of not less than 20% in the range where $O_3/TEOS$ is not less than 5.

In accordance with the above described embodiment, an interlayer insulating film having a smooth upper surface, satisfactory insulation, and no cracks may be formed due to good step coverage with a single TEOS-APCVD oxide film, by depositing a TEOS-APCVD oxide film with reaction gas including ozone and TEOS at a $O_3/TEOS$ ratio of not less than 5 reacted under the atmospheric pressure CVD method at a temperature within the range of 350°-450° C.

Though the above embodiment has been described in the case where the first and second layer of conductor patterns 12 and 18 are formed by aluminum, it is obvious that other conductor materials may be used for the formation.

Also, PSG film may be deposited as the TEOS-APCVD oxide film by adding phosphorus alkoxide to the reaction gas to prevent the penetration of moisture. Furthermore, it will be understood that BPSG film may be deposited as the TEOS-APCVD oxide film by adding boron alkoxide in addition to phosphorus alkoxide to the reaction gas.

Figure 4:
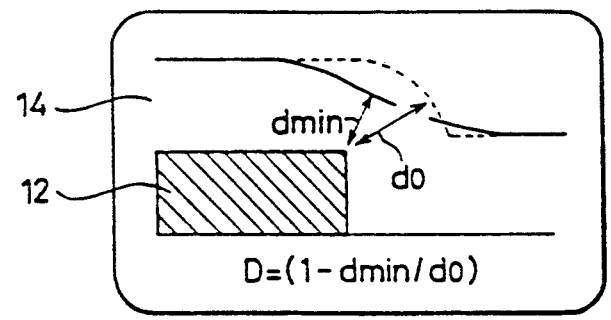
FIG. 4 is a sectional view for explaining the definition of step coverage D.

FIG. 4 is a sectional view for explaining the definition of step coverage D. The state of the step coverage in TEOS-APCVD oxide film 14 at the step portion formed by the first layer conductor 12 is shown enlarged in this figure. The broken line curve represents the interlayer insulating film isotropically deposited in a novel LPCVD (low pressure CVD) manner. The step coverage is defined by $D=(1-d_{min}/d_o)$, where $d_o$ represents the thickness of the virtual interlayer insulating film at the corner portion of the step of conductor 12, and where $d_{min}$ represents the minimum thickness of the TEOS-APCVD film 14 at the corner portion of the step of conductor 12. It is appreciated that the greater step coverage D is, the smoother the upper surface of the TEOS-APCVD film 14 is.

Figure 5A:
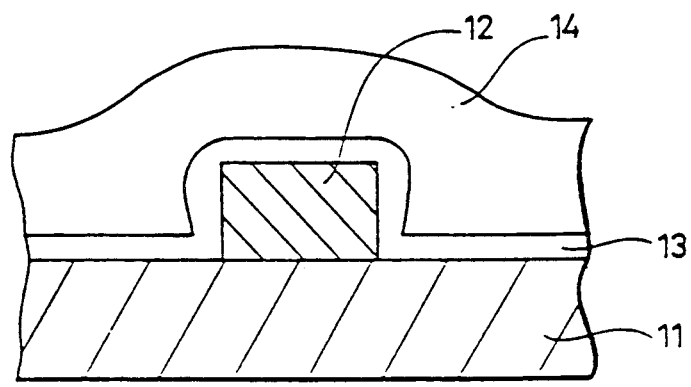
FIGS. 5A and 5B are sectional views for explaining another application of the present invention.
Figure 5B:
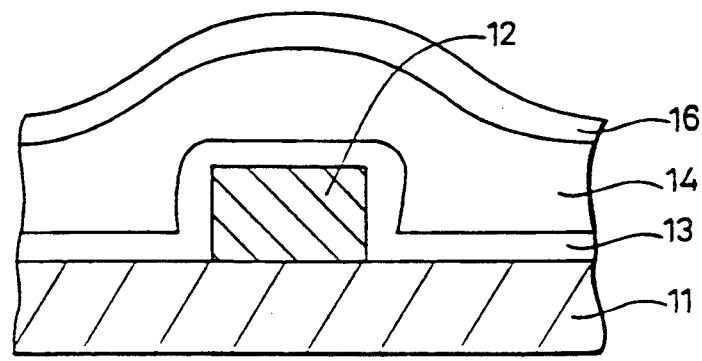

FIGS. 5A and 5B are sectional views for explaining another application of the present invention. In FIG. 5A, the interlayer insulating film includes a lower layer insulating film 13 deposited prior to TEOS-APCVD oxide film 14. In FIG. 5B, the interlayer insulating film further includes an upper layer insulating film 16 formed over TEOS-APCVD oxide film 14.

There is possibility that cracks are generated in TEOS-APCVD oxide film 14 by the stress generated by the expansion and shrinkage of the metal conductor 12 during the heat process. It is desirable to provide a lower layer insulating film 13 superior in crack-resistance. There is also the possibility of stress-migration occurring in the metal conductor 12, because TEOS-APCVD oxide film 14 has tension stress. It is therefore desirable to relax the stress by sandwiching TEOS-APCVD oxide film 14 with upper and lower layer insulating films 13 and 16 having compression stress.

This lower and upper layer insulating films 13 and 16 may be formed by using silane gas and nitrous oxide ($N_2O$), or by using TEOS and $O_2$, for example, under the PCVD method or the LPCVD method at about 700° C. The lower and upper insulating films 13 and 16 may also be formed as a PSG film using gas that has phosphine added to silane gas and $O_2$ under the atmospheric pressure CVD method. The PSG film can prevent the penetration of moisture.

Figure 6A:
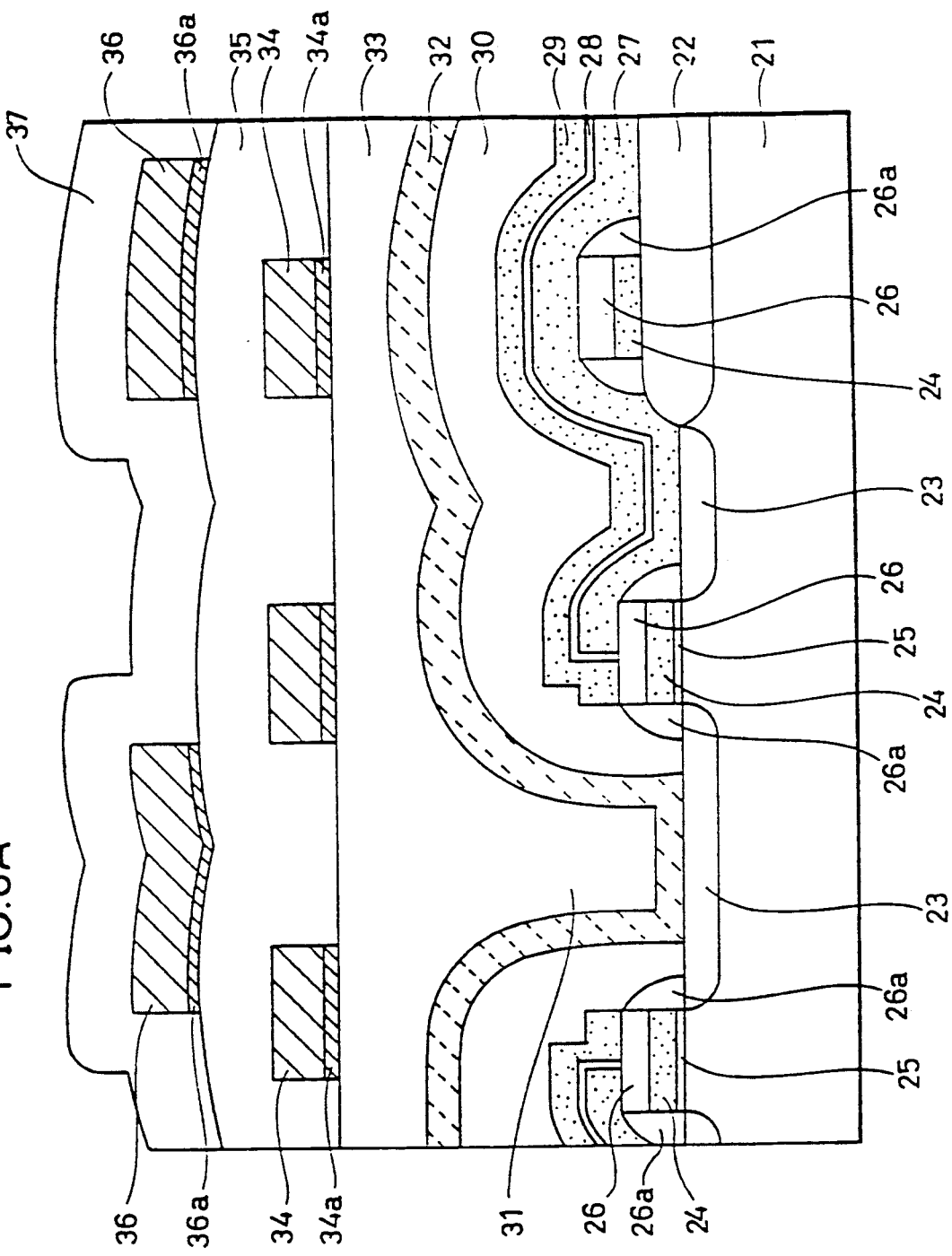
FIGS. 6A and 6B are schematic sectional views of a DRAM device.
Figure 6B:
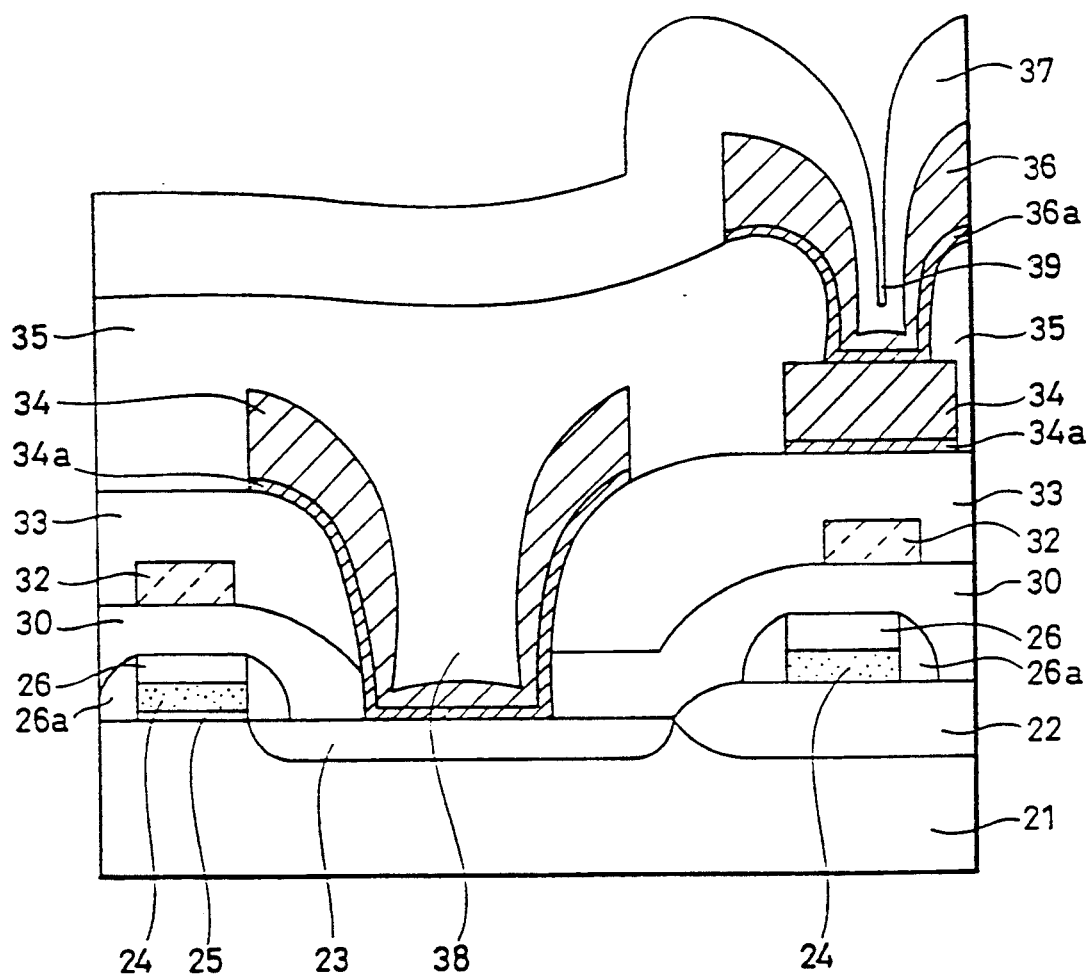

FIGS. 6A and 6B are schematic sectional views of a DRAM (Dynamic Random Access Memory) device for explaining another application of the present invention. FIG. 6A shows a portion of the memory cell region, whereas FIG. 6B shows a portion of the peripheral circuit. Referring to these figures, an isolation insulating region 22 is formed on the surface of semiconductor substrate 21. An impurity diffusion region 23 for the source/drain of a FET (Field Effect Transistor) is formed in the surface layer of substrate 21 enclosed by isolation region 22. A word line 24 of polysilicon is formed above the surface of substrate 21 with a gate insulating film 25 therebetween. Word line 24 can be formed by LPCVD using $SiH_4$. Word line 24 is covered by a first interlayer insulating film 26 and a sidewall insulating film 26a.

A capacitor lower electrode 27 of polysilicon is formed connected to the corresponding impurity region 23. Capacitor lower electrode 27 is covered by a capacitor dielectric film 28, and dielectric film 28 is covered by a capacitor upper electrode 29. Capacitor upper electrode 29 of polysilicon is covered by a second interlayer insulating film 30. In forming the polysilicon capacitor electrodes 27 and 29 by LPCVD, phosphorus may be doped by adding $PH_3$ gas.

A bit line 32 formed on second interlayer insulating film 30 is connected to the corresponding impurity region 23 via a contact hole 31. Bit line 32 may be formed of the alloy of tungsten and silicon by LPCVD or sputtering. Bit line 32 is covered by a third interlayer insulating film 33.

The first layer aluminum alloy wire 34 is formed on the third interlayer insulating film 33 via a barrier metal 34a. The first layer wire 34 is connected to one of impurity region 23 via contact hole 38. Barrier metal 34a such as of TiN or TiW can be formed by sputtering. The first layer wire 34 may be formed by sputtering aluminum alloy including Si or Cu. The first aluminum alloy wire 34 is covered with a fourth interlayer insulating film 35.

The second layer aluminum alloy wire 36 is formed on the fourth interlayer insulating film 35 via barrier metal 36a. The second wire 36 may be connected to the first layer wire 34 via contact hole 39. The second layer aluminum alloy wire 36 is covered with a passivation film 37 of silicon nitride. Passivation film 37 may be formed by PCVD using $SiH_4$ and $NH_3$.

Figure 7C:
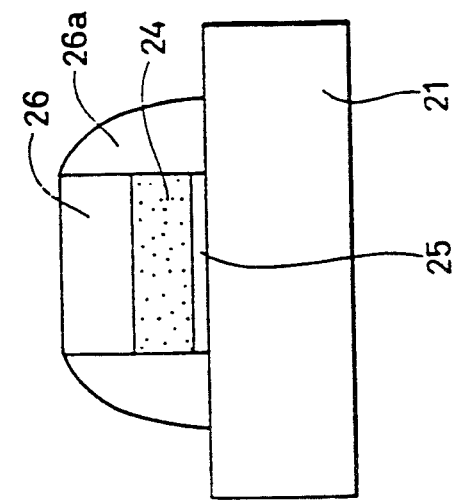
FIGS. 7A-7C are sectional views showing the formation steps of the sidewall insulating film.
Figure 7B:
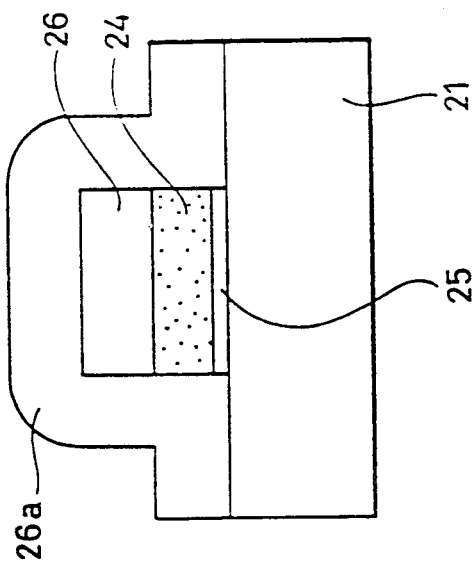
Figure 7A:
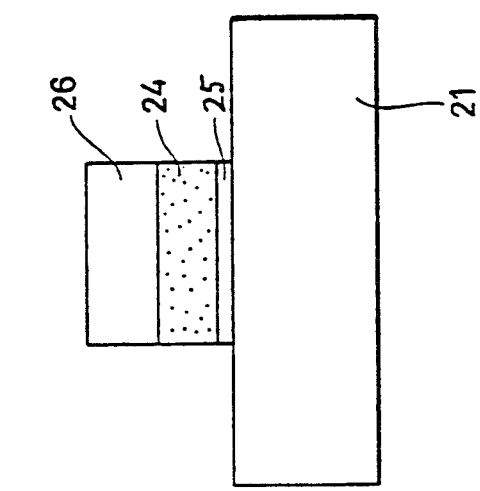

FIG. 7A and 7C are schematic sectional views showing the formation steps of the sidewall insulating film 26a of FIG. 6A.

Referring to FIG. 7A, gate insulating film 25, word line 24, and first interlayer insulating film 26 are layered in order over semiconductor substrate 21. First layer interlayer insulating film 26 may be formed by LPCVD using $SiH_4$ and $N_2O$ at a high temperature of 800° C.-900° C. The oxide film formed in the above mentioned manner is referred to as a normal oxide film hereinafter.

Referring FIG. 7B, the oxide film 26a is deposited conventionally by LPCVD using TEOS and $O_2$ at approximately 700° C., so as to cover gate insulating film 26, word line 24, first interlayer insulating film 26, and the surface of substrate 21. The oxide film formed in the above described manner is called a normal TEOS oxide film hereinafter. The normal oxide film is preferable in that moisture is not included. However, it is difficult to obtain satisfactory step coverage in the normal oxide film. In order to obtain satisfactory step coverage, oxide film 26a was conventionally formed of a normal TEOS oxide film.

Referring to FIG. 7C, a sidewall insulating film 26a is formed by etching anisotropically from a upper direction. Sidewall insulating film 26a of normal TEOS oxide film includes more moisture than the first interlayer insulating film 26 of the normal oxide film. Sidewall insulating film 26a including moisture is likely to trap hot electrons injected from the source/drain of the FET, whereby the trapped electrons will provide defective effect such as altering the threshold voltage of the FET.

The problem occurring in the case where sidewall insulating film 26a is formed of a normal TEOS oxide film is solved by forming sidewall insulating film 26a of the TEOS-APCVD oxide film according to the present invention. This reason is due to the TEOS-APCVD oxide film providing superior step coverage, as well as including almost no moisture.

The second interlayer insulating film 30 of FIG. 6A has a layered structure of the normal TEOS oxide film, SOG film, and the normal oxide film. It is therefore difficult to form a bit line 32 with satisfactory step coverage in contact hole 31, because moisture is discharged from the normal TEOS oxide film and SOG film at the sidewalls of the contact hole 31, as explained in association with FIG. 7. According to the present invention, it is possible to form the second interlayer insulating film 30 of a single TEOS-APCVD oxide film. Moisture will not be discharged from the sidewalls of contact hole 31 because TEOS-APCVD oxide film includes almost no moisture. Accordingly, the connection between bit line 32 and impurity region 23 is ensured.

Figure 8A:
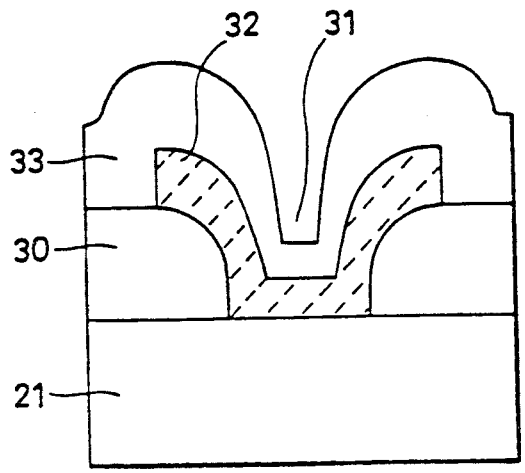
FIGS. 8A and 8B are sectional views showing the reflow of a conventional interlayer insulating film in a relatively large contact hole.
Figure 8B:
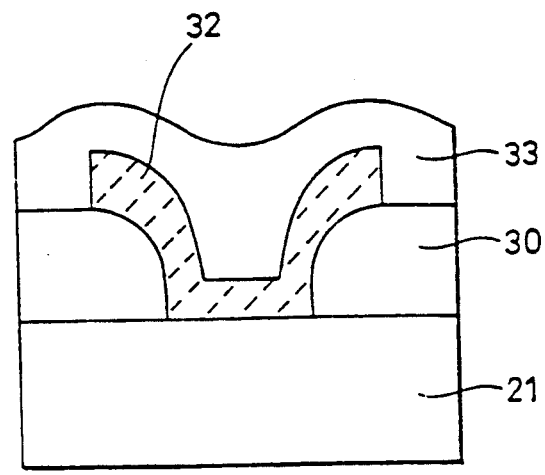

FIGS. 8A-10B are schematic sectional views showing the reflow process of the third interlayer insulating film 33 in the vicinity of contact hole 31 of FIG. 6A. Referring to FIG. 8A, a BPSG film 33 is deposited to cover bit line 32 by APCVD using $SiH_4$, $B_2H_6$, and $PH_3$ at 400° C.-500° C. Referring to FIG. 8B, the third interlayer insulating film 33 of BPSG film is smoothed by reflow at 900° C.-1000° C.

Figure 9A:
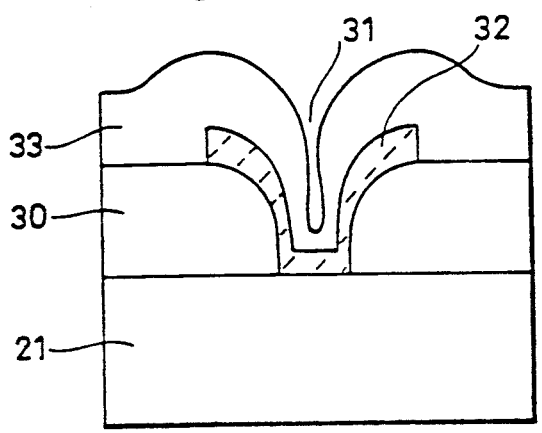
FIGS. 9A and 9B are sectional views showing the reflow of a conventional interlayer insulating film in a relatively small contact hole.
Figure 9B:
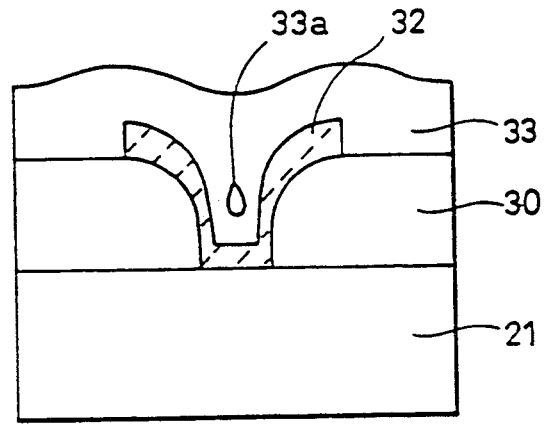

The third layer insulating film 33 may often comprise a void 33a in contact hole 31 after reflow, as in FIG. 2B, when the size of contact hole 31 is reduced, as shown in FIG. 9A, due to the increase in integration density of the DRAM device.

Figure 10A:
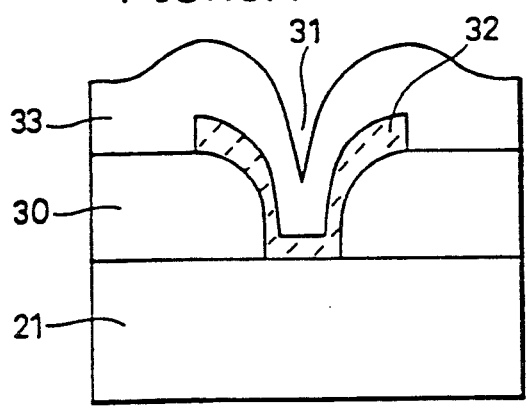
FIGS. 10A and 10B are sectional views showing the reflow of the inventive interlayer insulating film in a relatively small contact hole.
Figure 10B:
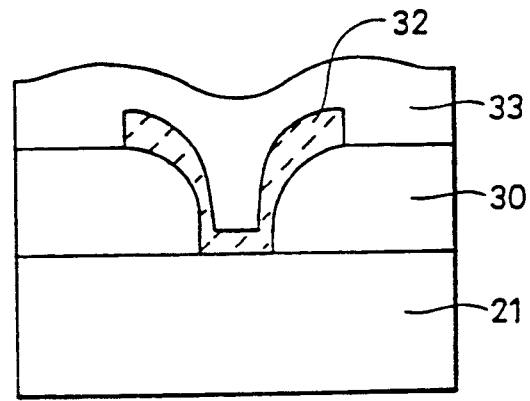
Figure 11A:
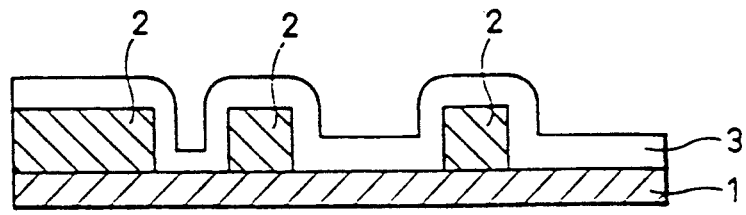
FIGS. 11A-11D are sectional views for explaining the method of forming interlayer insulating films by prior art.
Figure 11B:
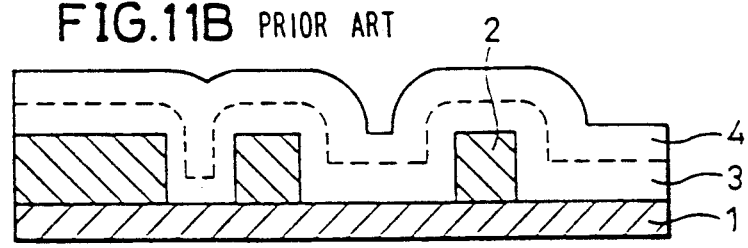
Figure 11C:
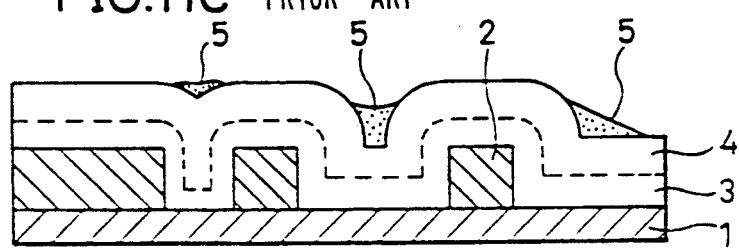
Figure 11D:
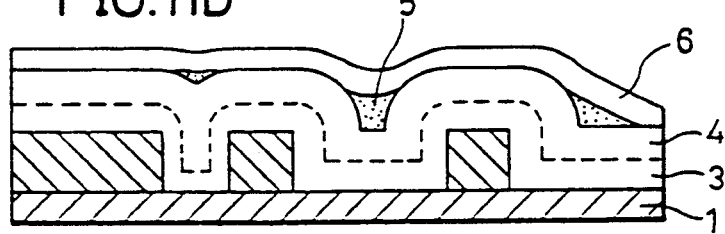

With reference to FIG. 10A, the third interlayer insulating film 33 is formed by depositing the TEOS-APCVD oxide film by doping boron and phosphorus according to the present invention. As stated before, TEOS-APCVD oxide film 33 provides satisfactory step coverage in the vicinity of contact hole 31. Therefore the third interlayer insulating film 33 does not include a void in contact hole 31, as shown in FIG. 10B, even after reflow. The conventional BPSG film was smoothed by reflow at 900° C.–1000° C. However, the inventive TEOS-APCVD oxide film deposited by doping boron and phosphorus can be smoothed sufficiently by reflow at 850° C., due to satisfactory step coverage.

Figure 12:
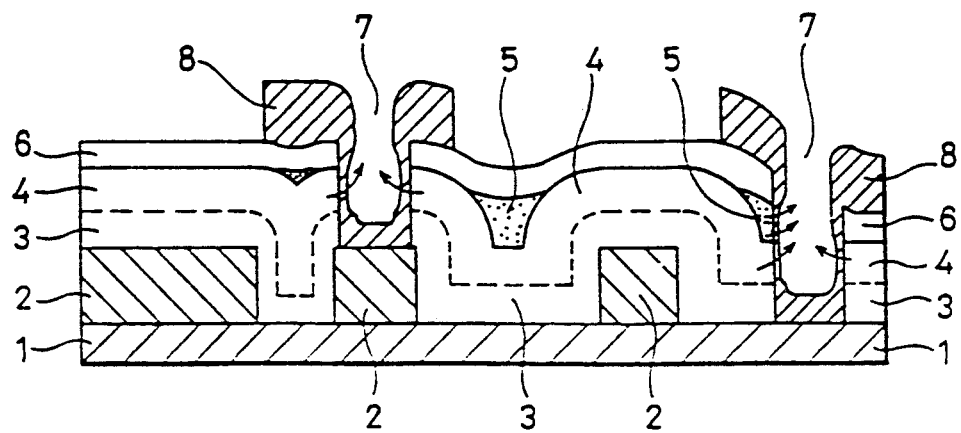
FIG. 12 is a sectional view of a contact hole portion within the interlayer insulating films formed by prior art.
Figure 13:
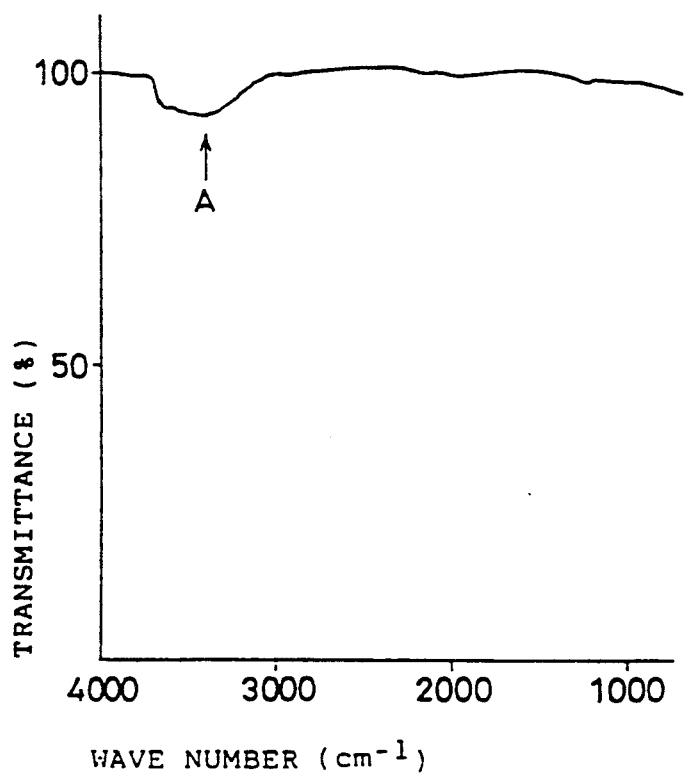
FIG. 13 is a graph showing the infrared radiation absorption of the TEOS-LPCVD oxide film.

The fourth interlayer insulating film 35 of FIGS. 6A and 6B have a layered structure of TEOS-PCVD oxide film, TEOS-LPCVD oxide film, SOG film, and PSG film. The fourth interlayer insulating film 35 having such a layered structure has the problems described in association with FIG. 12. It is possible to solve all the problems described in association with FIG. 12 by forming the fourth interlayer insulating film 35 by the inventive TEOS-APCVD oxide film.

In accordance with the present invention, the ratio of ozone to silicon alkoxide is adjusted to be not less than 5 in the reaction gas including at least ozone and silicon alkoxide, whereupon the reaction gas is reacted at a temperature of 350°–450° C. under an atmospheric pressure CVD method, to form an interlayer insulating film of sufficient thickness having a smooth upper surface with minimum gas discharge, and not liable to introduce cracks.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first layer conductor pattern,
   an interlayer insulating film including at least an insulating film formed by CVD reacting a reaction gas including at least silicon alkoxide and ozone adjusted so that the ratio of ozone to silicon alkoxide is not less than 5 under atmospheric pressure at a temperature of 350° C.–450° C., to cover said first layer conductor pattern, and
   a second layer conductor pattern formed on said interlayer insulating film.

2. The semiconductor device according to claim 1, wherein said semiconductor device comprises a DRAM device.

3. The semiconductor device according to claim 2, wherein
   said first layer conductor pattern comprises a word line,
   said interlayer insulating film is used as the sidewall insulating film of said word line.

4. The semiconductor device according to claim 2, wherein
   said first layer conductor pattern comprises a capacitor electrode,
   said second layer conductor pattern comprises a bit line.

5. The semiconductor device according to claim 2, wherein
   said first layer conductor pattern comprises a bit line,
   said interlayer insulating film is doped with boron and phosphorus.

6. The semiconductor device according to claim 2, wherein said first layer and second layer conductor patterns comprise aluminum alloy wire.

* * * * *